United States Patent
Chou (10) Patent No.: US 10,798,320 B1
(45) Date of Patent: Oct. 6, 2020

(54) IMAGE SENSOR, COMPARATOR CIRCUIT AND METHOD THEREOF

(71) Applicant: Taiwan Semiconductor Manufacturing Co., Ltd., Hsinchu (TW)

(72) Inventor: Po-Sheng Chou, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/454,093

(22) Filed: Jun. 27, 2019

(51) Int. Cl.
*H04N 5/355* (2011.01)
*H04N 5/378* (2011.01)
*H01L 27/146* (2006.01)

(52) U.S. Cl.
CPC ....... *H04N 5/355* (2013.01); *H01L 27/14645* (2013.01); *H04N 5/378* (2013.01)

(58) Field of Classification Search
CPC .... H04N 5/3575; H04N 5/3765; H04N 5/378; H04N 5/228; H04N 5/2283; H04N 5/37455; H04N 5/3745
See application file for complete search history.

(56) References Cited

U.S. PATENT DOCUMENTS

| | | | |
|---|---|---|---|
| 6,423,957 B1 | 7/2002 | Kim et al. | |
| 6,727,486 B2 | 4/2004 | Choi | |
| 2011/0037868 A1* | 2/2011 | Ota | H03M 1/188 |
| | | | 348/222.1 |
| 2014/0166857 A1* | 6/2014 | Ookuma | H04N 5/3765 |
| | | | 250/208.1 |
| 2015/0263751 A1* | 9/2015 | Sato | H03M 1/00 |
| | | | 341/118 |
| 2016/0360129 A1* | 12/2016 | Yoshida | H04N 5/378 |
| 2017/0078607 A1* | 3/2017 | Totsuka | H04N 5/37455 |

* cited by examiner

*Primary Examiner* — Lin Ye
*Assistant Examiner* — Tuan H Le
(74) *Attorney, Agent, or Firm* — JCIPRNET (57) ABSTRACT

A comparator circuit of an image sensor that is configured to compare a pixel signal and a ramp signal is introduced. The comparator circuit includes a first comparator circuit and a second comparator circuit. The first comparator circuit includes differential inputs that receive the pixel signal and the ramp signal, respectively. The second comparator circuit includes differential inputs that receive the pixel signal and the ramp signal, respectively. The second comparator circuit is activated when a level of the pixel signal is smaller than a first threshold value, the first comparator circuit is activated when the level of the pixel signal is greater than a second threshold value, and the first threshold value is greater than the second threshold value.

20 Claims, 7 Drawing Sheets

IMAGE SENSOR, COMPARATOR CIRCUIT AND METHOD THEREOF

BACKGROUND

An image sensor is used in a wide range of applications in electronic devices such as digital cameras, mobile phones, computers and the like. The image sensor includes a comparator circuit that is used to compare a pixel output and a ramp signal to obtain an output signal. However, a certain amount of voltage is required to maintain the adequate impedance for accurate current source of the comparator circuit. If the certain amount of voltage is not reached, the output signal of the comparator circuit becomes nonlinear as opposed to input signals. As a result, a dynamic range of the comparator circuit is low.

As demand for low power consumption more advanced image sensor has grown recently, there has grown a need for more advanced designs of the comparator circuit and the image sensor that have low power consumption and wide dynamic range.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
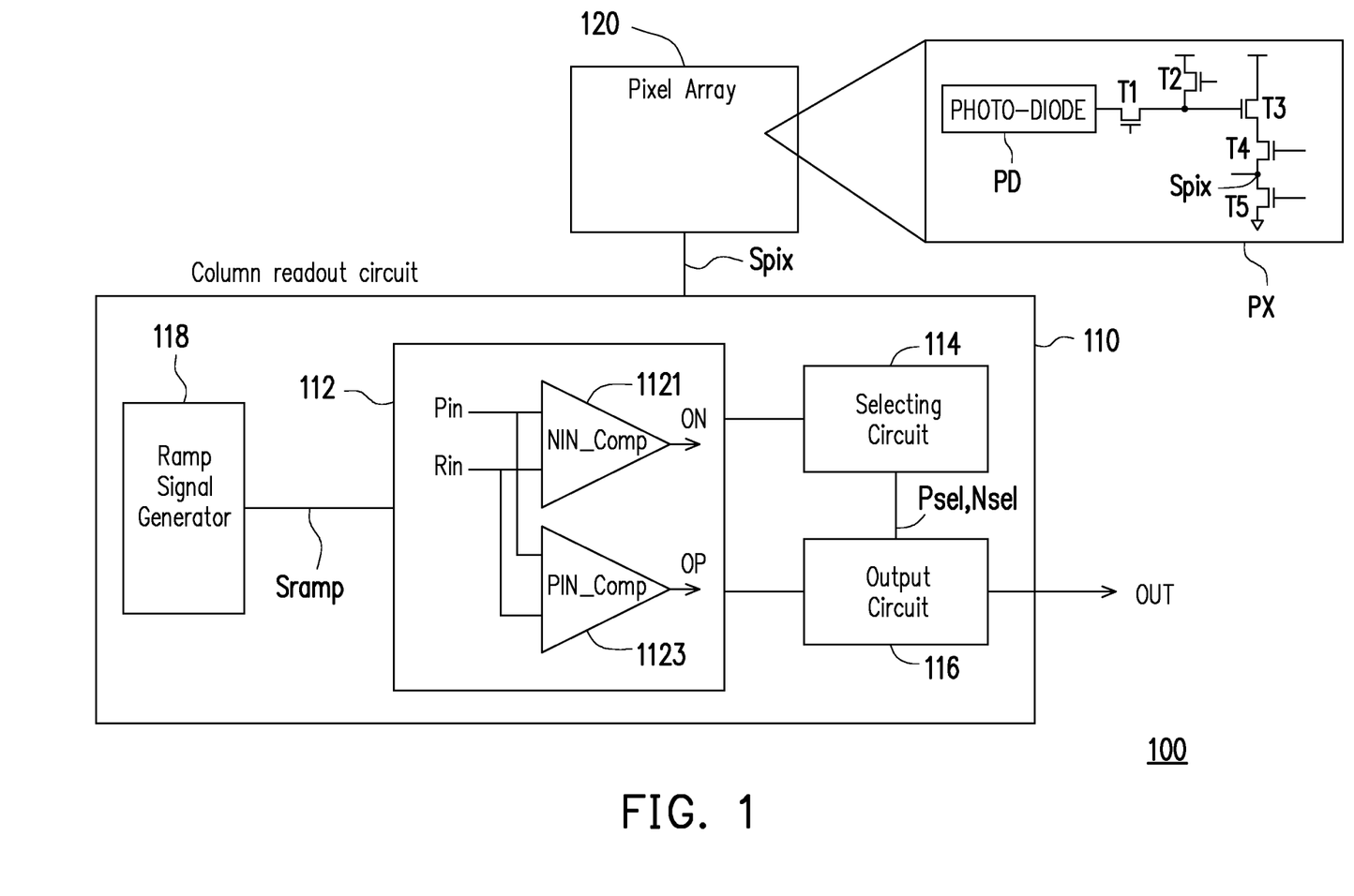
FIG. 1 is a schematic diagram illustrating an image sensor in accordance with some embodiments.

FIG. 1 is a schematic diagram illustrating an image sensor 100 in accordance with some embodiments. The image sensor 100 may include a pixel array 120 and a column readout circuit 110. The pixel array 120 may include a plurality of pixels PX arranged in rows (not shown) and columns (not shown). In some embodiments, the pixels PX of the pixel array 120 are arranged in a matrix form, but the disclosure is not limited thereto. Each of the pixels PX may include a light sensing element such as a photodiode PD and a plurality of transistors T1 through T5. The photodiode PD is configured to accumulate charges corresponding to sensed light. The transistors T1 through T5 include a transfer transistor T1, a reset transistor T2, a source follower transistor T3, a row selecting transistor T4 and a transistor T5. The pixel PX of the pixel array 120 are not limited to the structure shown in FIG. 1. Rather, any pixel structure that has a function of sensing light to generate a pixel signal falls within the scope of the disclosure.

In some embodiments, each column of the pixel array 120 is coupled to a column readout circuit 110. The readout circuit 110 may include a comparator circuit 112, a selecting circuit 114 and an output circuit 116. The comparator circuit 112 may include a NMOS in, NIN comparator 1121 (also refer to as a first comparator circuit) and a PMOS in, PIN comparator 1123 (also referred to as a second comparator circuit). Both of the NIN comparator 1121 and the PIN comparator 1123 are configured to compare a pixel signal Spix and a ramp signal Sramp to generate comparison results at nodes ON and OP, respectively. However, an activation region of the NIN comparator 1121 is different from an activation region of the PIN comparator 1123. The selecting circuit 114 is coupled to the comparator circuit 112 and is configured to generate selecting signals Psel and Nsel according to the comparison results at the nodes ON and OP. The output circuit 116 is coupled to the comparator circuit 112 and the selecting circuit 114, and is configured to generate the readout signal OUT according to the selecting signals Psel and Nsel received from the selecting circuit 114 and the comparison results received from the comparator circuit 112.

In some embodiments, the readout circuit 110 further includes a ramp signal generator 118 that is configured to generate the ramp signal Sramp. In some alternative embodiments, the ramp signal generator 118 are disposed outside the readout circuit 110. In other words, the ramp signal generator 118 could be disposed anywhere the in the image sensor 100.

Figure 2:
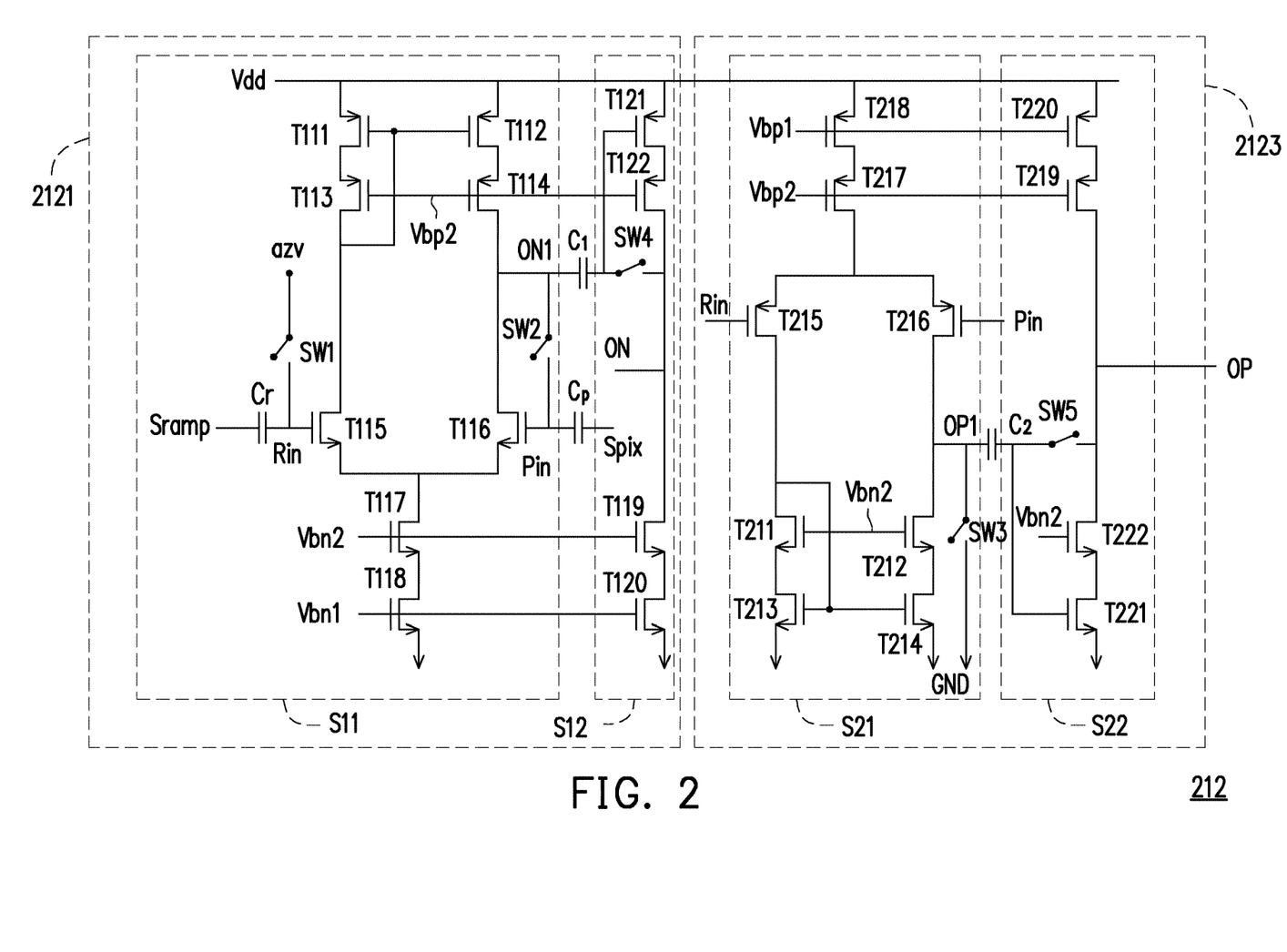
FIG. 2 is a schematic diagram illustrating a comparator circuit of an image sensor in accordance with some embodiments.

FIG. 2 is a schematic diagram illustrating a comparator circuit 212 in accordance with some embodiments. The comparator circuit 212 includes a NIN comparator 2121 and a PIN comparator 2123 which are similar to the NIN comparator 1121 and the PIN comparator 1123 shown in FIG. 1. Each of the NIN comparator 2121 and the PIN comparator 2123 receives the pixel signal Spix and the ramp signal Sramp, and is configured to compare the pixel signal Spix and the ramp signal Sramp to generate a comparison result. In some embodiments, each of the NIN comparator 2121 and the PIN comparator 2123 may be a two-stage comparator that includes a first stage and a second stage. The NIN comparator 2121 includes a first stage S11 and a second stage S12; and the PIN comparator 2123 includes a first stage S21 and a second stage S22. The first stage S11 of the NIN comparator 2121 is configured to receive the pixel signal Spix and the ramp signal Sramp to generate a first-stage output signal at the node ON1, and the second stage S12 of the NIN comparator 2121 is configured to generate the comparison result at the node ON based on the first-stage output signal. The first stage S21 of the PIN comparator 2123 is configured to receive the pixel signal Spix and the ramp signal Sramp to generate a first-stage output signal at the node OP1, and the second stage S22 is configured to generate the comparison result at the node OP based on the first-stage output signal.

In some embodiments, the first stage S11 of the NIN comparator 2121 includes differential inputs Rin and Pin, where the differential input Pin receives the pixel signal Spix through a coupling capacitor Cp and the differential input Rin receives the ramp signal Sramp through a coupling capacitor Cr. In this way, the differential inputs Rin and Pin may have their own bias voltages. The differential inputs Rin and Pin may be coupled to gate electrodes of differential transistor pair T115 and T116. The first stage S11 of the NIN comparator 2121 may further include a current mirror circuit which is formed by transistors T111, T112, T113 and T114. The current mirror circuit is coupled to drain electrodes of the differential transistor pair T115 and T116, in which the transistors T113 and T114 of the current mirror circuit are biased by a bias voltage Vbp2. The first stage S11 of the NIN comparator 2121 may further include a current source circuit which is formed by the transistors T117 and T118. The current source circuit is coupled to the source electrodes of the differential transistor pair T115 and T116, and the current source circuit is configured to supply a current to the source electrodes of the differential transistor pair T115 and T116. The transistors T117 and T118 of the current source circuit are biased by bias voltages Vbn2 and Vbn1, respectively.

In some embodiments, the first stage S11 of the NIN comparator 2121 may further include auto-zero switches SW1 and SW2. The auto-zero switch SW1 is coupled between the differential input Rin and a reference node azv; and the auto-zero switch SW2 is coupled between the differential input Pin and the node ON1 of the first stage S11 of the NIN comparator 2121. The auto-zero switches SW1 and SW2 are configured to reset the differential inputs Rin and Pin to the levels of the reference node azv and the node ON, respectively. In some embodiments, the switches SW1 and SW2 are controlled to be turned on or off by a same control signal.

The first stage S11 of the NIN comparator 2121 is coupled to the second stage S12 of the NIN comparator 2121 through a coupling capacitor C. The second stage S12 of the NIN comparator 2121 is configured to generate the comparison result at the node ON based on the first-stage output signal from the node ON1 of the first stage S11. In some embodiments, the second stage S12 of the NIN comparator 2121 includes transistors T119, T120, T121 and T122, where the gate electrodes of the transistors T119, T120 are biased by the bias voltages Vbn2 and Vbn1, respectively. The gate electrode of the transistor T121 is coupled to the node ON1 through the capacitor C1, and the gate electrode of the transistor T122 is biased by the bias voltage Vbp2. The second stage S12 may further includes a switch SW4, which is coupled between the node ON of the second stage S12 and the capacitor C1. In some embodiments, the switches SW1, SW2 and SW4 may be controlled by the same control signal.

In some embodiments, the first stage S21 of the PIN comparator 2123 has the same differential inputs Rin and Pin as the first stage S1 of the NIN comparator 2121. The differential inputs Rin and Pin of the PIN comparator 2123 are coupled to gate electrodes of differential transistor pair T215 and T216. In some embodiments, the conductivity type of the differential transistor pair T215 and T216 of the PIN comparator 2123 is different from the conductivity type of the differential transistor pair T115 and T116 of the NIN comparator 2121.

The first stage S21 of the PIN comparator 2123 may further include a current mirror circuit which is formed by transistors T211, T212, T213 and T214. The current mirror circuit is coupled to drain electrodes of the differential transistor pair T215 and T216. The transistors T211, T212, T213 and T214 may have the same conductivity type, and the conductivity type of the transistors T211, T212, T213 and T214 in the PIN comparator 2123 is different from the conductivity type of the transistors T111, T112, T113 and T114 in the NIN comparator 2121. The transistors T213 and T214 may be biased by a bias voltage Vbn2.

In some embodiments, the first stage S21 of the PIN comparator 2123 may further include a current source circuit which is formed by the transistors T217 and T218. The current source circuit of the PIN comparator 2123 is coupled to the source electrodes of the differential transistor pair T215 and T216. The transistors T217 and T218 of the current source circuit are biased by bias voltage Vbp2 and Vbp1, respectively; and the conductivity type of the transistors T217 and T218 in the PIN comparator 2123 is different from the conductivity type of the transistors T117 and T118 in the NIN comparator 2121. In some embodiments, the first stage S21 of the PIN comparator 2123 may further include switch SW3 coupled between the node OP1 and a reference node (e.g., GND). The switch SW3 is configured to reset the node OP1 to the ground level for faster operation purpose. In some embodiments, the switches SW1, SW2, SW4 and SW3 are controlled by the same control signal.

In some embodiments, the second stage S22 of the PIN comparator 2123 is coupled to the first stage S21 of the PIN comparator 2123 through a coupling capacitor C2. The capacitors C and C2 are coupled between the first stage and the second stage of the NIN comparator 2121 and the PIN comparator 2123, such that second stages S12 and S22 of the NIN comparator 2121 and the PIN comparator 2123 may have their own bias voltages and boost up the gain for low noise purpose. The second stage S22 may include transistors T219, T220, T221 and T222, in which the gate electrodes of the transistors T219 and T220 are biased by the bias voltages Vbp2 and Vbp1, respectively; the gate electrode of the transistor T221 is coupled to the node OP1 thought the capacitor C2 and the gate electrode of the transistor T222 is biased by the bias voltage Vbn2. The second stage S22 of the PIN comparator 2123 may further include a switch SW5 coupled between the node OP of the second stage S22 and the capacitor C2. In some embodiments, the switches SW1 through SW5 are controlled by the same control signal.

In some embodiments, the bias voltages Vbp1, Vbp2, Vbn1, Vbn2 of the current source circuits in the NIN comparator 2121 and the PIN comparator 2123 must be large enough to minimize the comparator-to-comparator voltage variations which generate so-call column fixed pattern noise. A readout circuit of the image sensor may include thousands of comparators to digitize the large pixel array signals and need to guarantee the uniformity across the whole comparator array.

Figure 3:
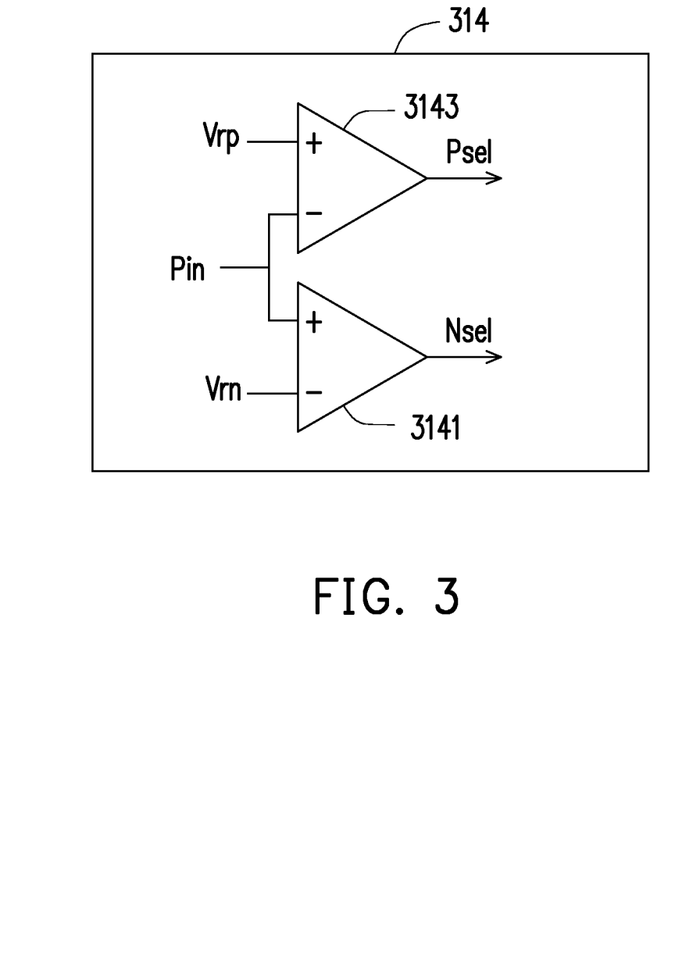
FIG. 3 is a schematic diagram illustrating a selecting circuit of an image sensor in accordance with some embodiments.

FIG. 3 is a schematic diagram illustrating a selecting circuit 314 which includes auxiliary comparator circuits 3141 and 3143 in accordance with some embodiments. The comparator circuit 3141 is configured to compare the pixel signal at the differential input Pin with a reference voltage Vrn to output a selecting signal Nsel. The comparator circuit 3143 is configured to compare the pixel signal at the differential input Pin with a reference voltage Vrp to output a selecting signal Psel. The selecting signals Nsel and Psel are used to determine the output of which one of the NIN comparator circuit and PIN comparator circuit is excluded.

In some embodiments, when a level of the pixel signal at the differential input Pin is greater than the reference voltage Vrn, the comparator circuits 3141 outputs the selecting signal Nsel to activate the NIN comparator circuit. As such, the comparison result at the node ON generated by NIN comparator circuit is used to generate the readout signal OUT. When the level of the pixel signal at the differential input Pin is not greater than the reference voltage Vrn, the NIN comparator circuit output is deactivated, and the comparison result at the node ON generated by NIN comparator circuit is excluded. When the level of the pixel signal at the differential input Pin is smaller than the reference voltage Vrp, the PIN comparator circuit output is activated and the comparison result at the node OP is used to generate the readout signal OUT. When the level of the pixel signal at the differential input Pin is not smaller than the reference voltage Vrp, the comparison result at the node OP generated by PIN comparator circuit is excluded. In other words, an output of NIN comparator circuit is excluded when the level of the pixel signal Pin is not greater than the reference voltage Vrn; and an output of PIN comparator circuit is excluded when the level of the pixel signal Pin is not smaller than the reference voltage Vrp.

Figure 5:
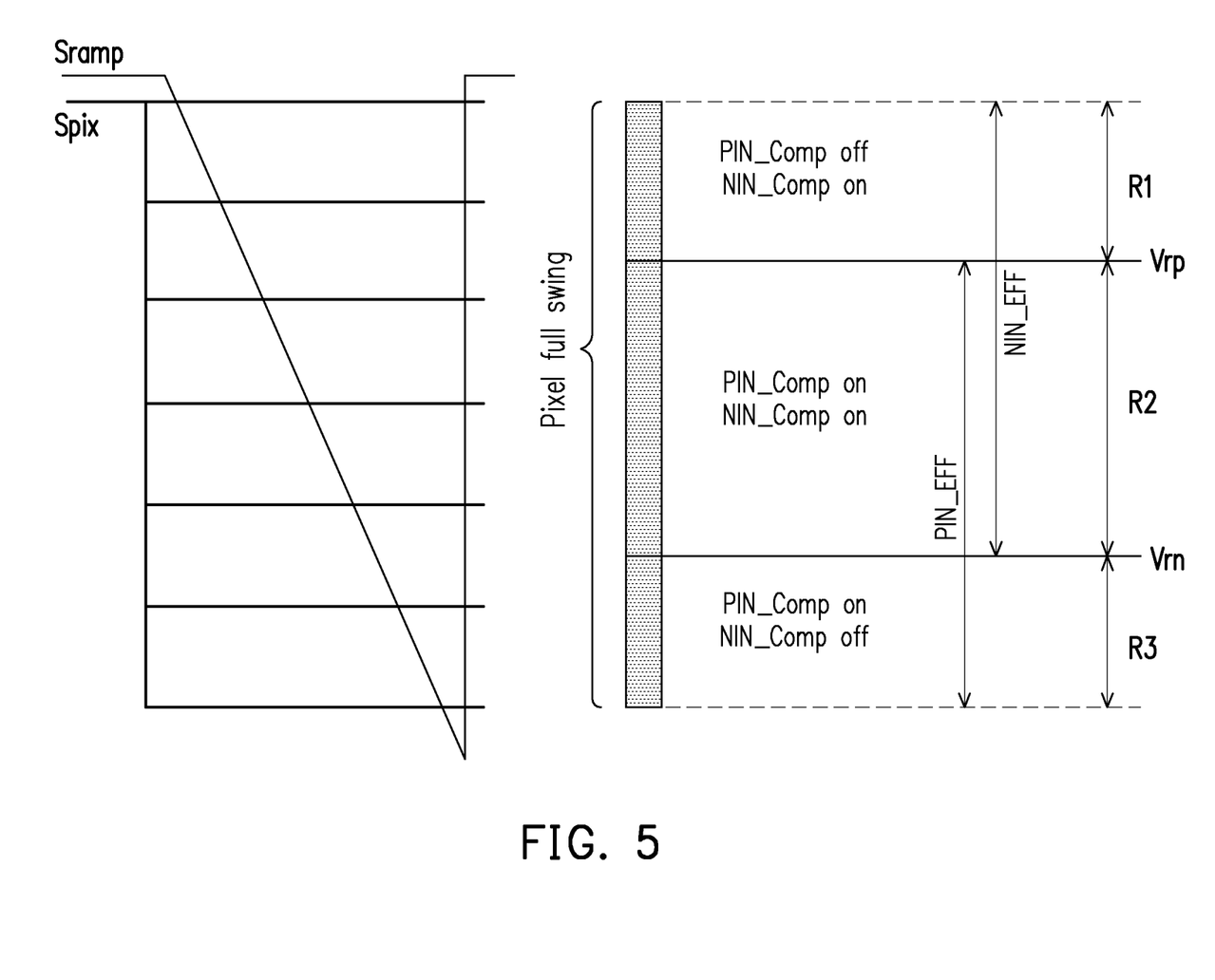
FIG. 5 illustrates activation regions of comparator circuits of an image sensor in accordance with some embodiments.

The operations of the NIN comparator circuit and the PIN comparator circuit depend on the level of the pixel signal at the differential input Pin. Referring to FIG. 3 and FIG. 5, in some embodiments, the full voltage swing of the pixel signal may be divided into three different regions R1, R2 and R3. The region R1 is from the reference voltage Vrp to the highest voltage level of the full voltage swing of the pixel signal; the region R2 is from the reference voltage Vrn to the reference voltage Vrp; and the region R3 is from the lowest voltage level of the full voltage swing of the pixel signal to the reference voltage Vrn. The reference voltage Vrp is greater than the reference voltage Vrn.

When the level of the pixel signal falls within the region R1, the NIN comparator circuit is activated (or turned on) and the PIN comparator circuit is deactivated (or turned off). When the level of the pixel signal Pin falls within the region R3, the PIN comparator circuit is activated (or turned on) and the NIN comparator circuit is deactivated (or turned off). When the level of the pixel signal Pin falls within the region R2, both of the NIN comparator circuit and the PIN comparator circuit are activated (or turned on). As shown in FIG. 5, the regions R1 and R2 may be referred to as an activation region of the NIN comparator circuit; and the regions R2 and R3 may be referred to as an activation region of the PIN comparator circuit. In other words, the activation region of the NIN comparator circuit overlaps the activation region of the PIN comparator circuit.

Since the output of the PIN comparator circuit would become nonlinearly in the region R1 and the output of the NIN comparator circuit would become nonlinearly in the region R3, the exclusion of the PIN comparator circuit output in the region R1 and the exclusion of the PIN comparator circuit output in the region R3 may improve linearity of the comparator circuit. In addition, the dynamic range of the comparator circuit is improved.

Figure 4:
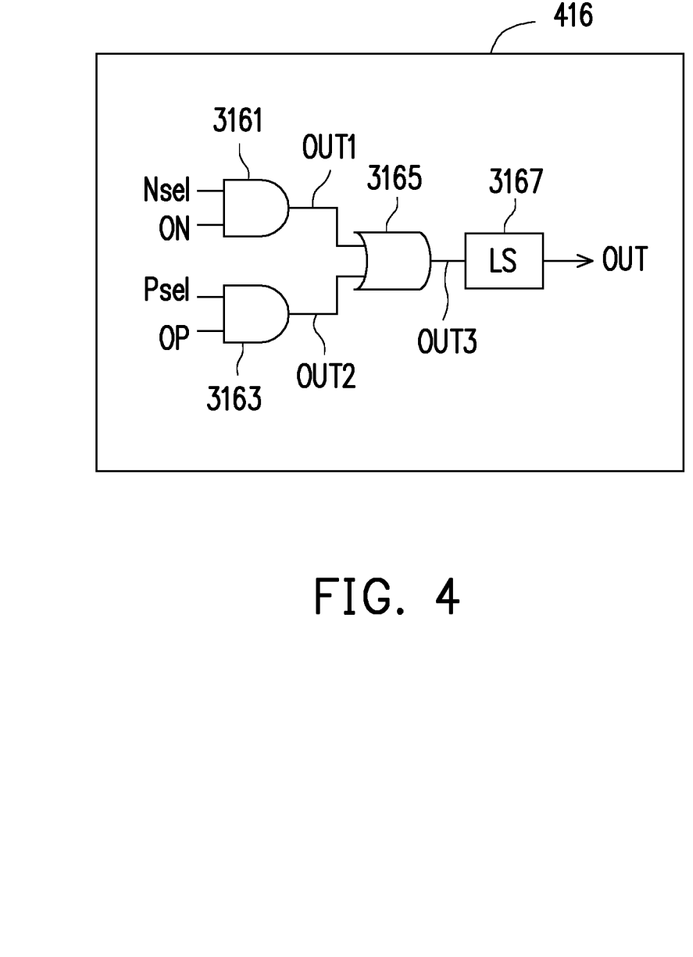
FIG. 4 is a schematic diagram illustrating an output circuit of an image sensor in accordance with some embodiments.

FIG. 4 is a schematic diagram illustrating an output circuit 416 in accordance with some embodiments. The output circuit 416 may includes a first logic circuit 3161, a second logic circuit 3163, a third logic circuit 3165 and a level shifter 3167. In some embodiments, the first logic circuit 3161 and the second logic circuit 3163 are AND logic gates; and the third logic circuit 3165 is an OR logic gate. The first logic circuit 3161 receives the selecting signal Nsel and the comparison result at the node ON of the NIN comparator circuit as inputs, and is configured to perform a first logic operation to the received inputs (Nsel and comparison result at the node ON) to generate an output OUT1. Similarly, the second logic circuit 3163 receives the selecting signal Psel and the comparison result at the node OP of the PIN comparator circuit as inputs, and is configured to perform a second logic operation to the received inputs (Psel and comparison result at the node OP) to generate an output OUT2. In some embodiments, the first logic operation and the second logic operation are an AND operation.

The third logic circuit 3165 receives the outputs OUT1 and OUT2 as inputs, and is configured to perform a third logic operation to the received outputs OUT1 and OUT2 to generate the output OUT3. The third logic operation may be an OR operation in some embodiments. The level shifter 3167 is configured to translate the output OUT3 to generate the readout signal OUT.

Figure 6:
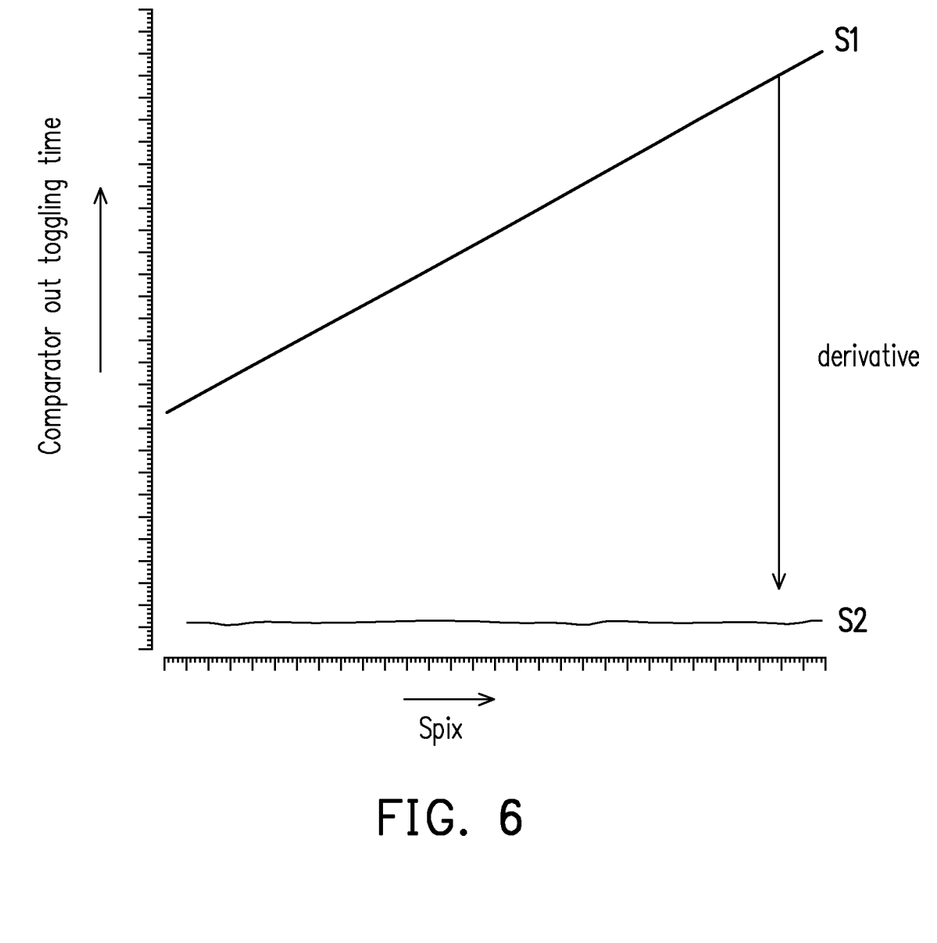
FIG. 6 is a diagram illustrating a swing linear range of a comparator circuit in accordance with some embodiments.

FIG. 6 is a diagram illustrating a swing linear range of a comparator circuit in accordance with some embodiments. The horizontal axis of the diagram shown in FIG. 6 illustrates the voltage swing of the pixel signal Spix; and the vertical axis of the diagram shown in FIG. 6 illustrates the toggling time of the comparator circuit output (or a strobe time of the comparator circuit output). FIG. 6 shows signals S1 and S2, where the signal S1 illustrates the toggling time (or strobe time) of comparator circuit output in relation to the voltage swing of the pixel signal, and the signal S2 is a derivative of the signal S1. The shapes of the signals S1 and S2 proves that the linearity of the comparator output.

Figure 7A:
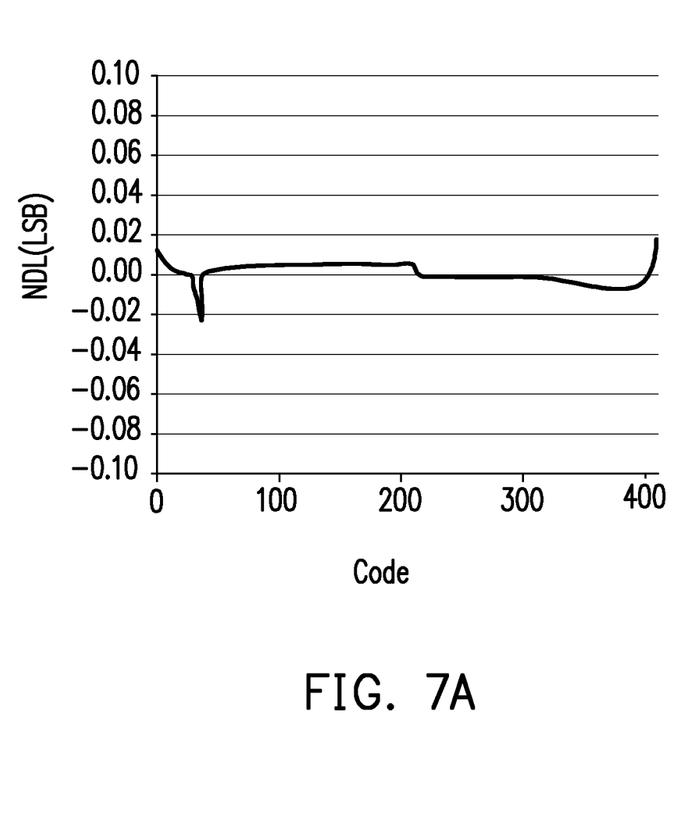
FIG. 7A through 7B are diagrams illustrating differential nonlinearity and integral nonlinearity values of a comparator circuit in accordance with some embodiments.
Figure 7B:
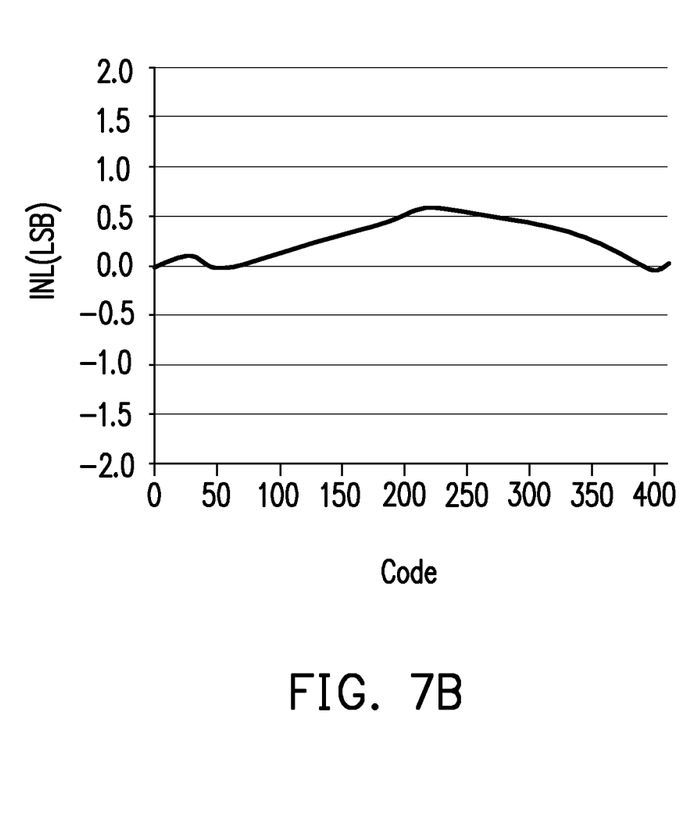

FIG. 7A through 7B illustrate exemplary differential nonlinearity (DNL) and integral nonlinearity (INL) values which are calculated according to the comparator circuit output strobe time in accordance with some embodiments. The DNL indicates point to point linearity and the INL indicates integrated points linearity. The horizontal axis of the diagrams shown in FIGS. 7A and 7B indicates the input codes or input signals of the comparator circuit; the vertical axis of the diagram shown in FIG. 7A indicates the DNL values; and the vertical axis of the diagram shown in FIG. 7B indicates the INL values. FIGS. 7A and 7B show that the variations of the DNL and the INL are relatively small, thereby proving the linearity of the comparator circuit in the embodiments of the disclosure.

Figure 8:
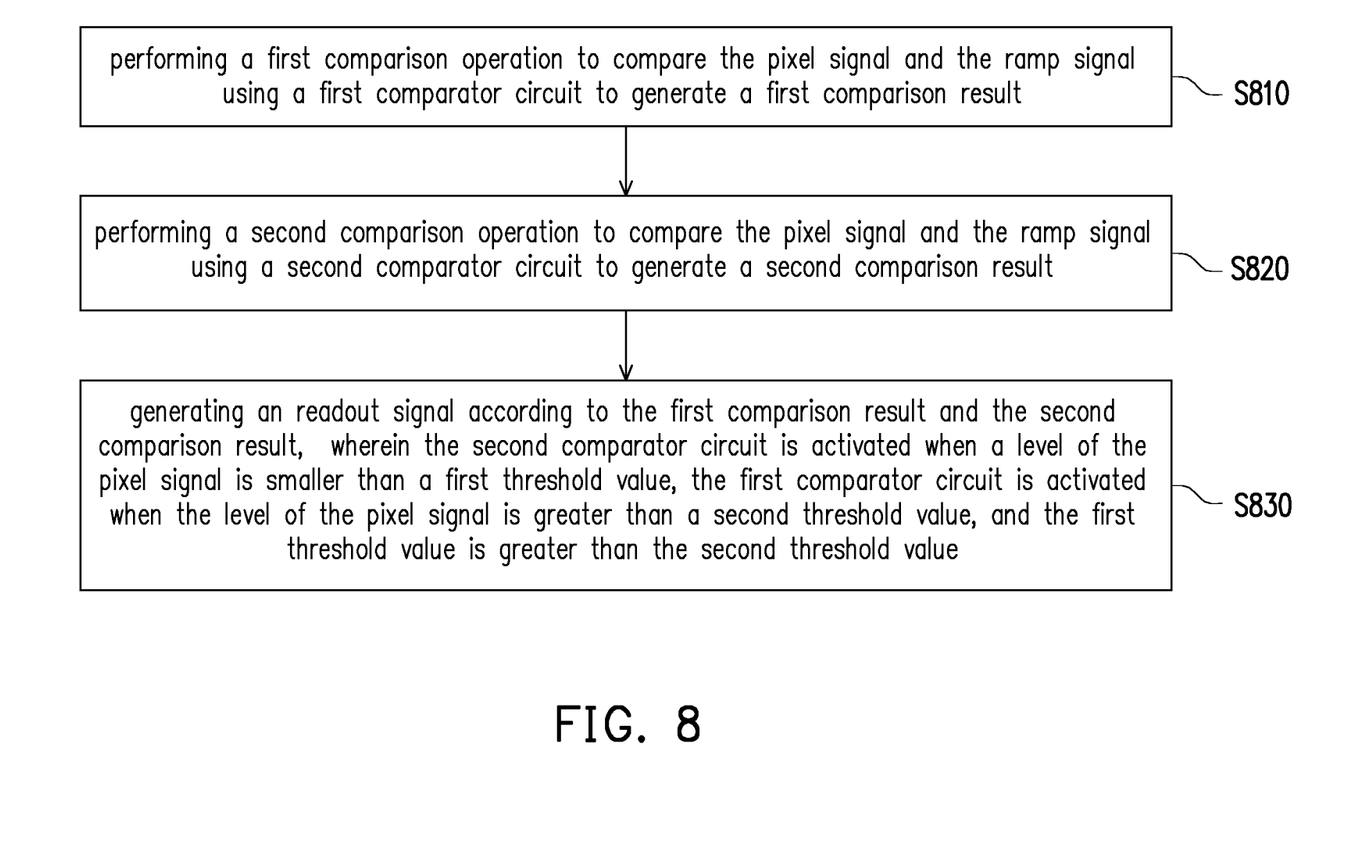
FIG. 8 is a flowchart diagram illustrating a method for comparing a pixel signal and a ramp signal in accordance with some embodiments.

FIG. 8 is a flowchart diagram illustrating a method for comparing a pixel signal and a ramp signal in accordance with some embodiments. In step S810, a first comparison operation is performed to compare the pixel signal and the ramp signal using a first comparator circuit to generate a first comparison result. In step S820, a second comparison operation is performed to compare the pixel signal and the ramp signal using a second comparator circuit to generate a second comparison result. In step S830, a readout signal is generated according to the first comparison result and the second comparison result. The second comparator circuit is activated when a level of the pixel signal is smaller than a first threshold value, the first comparator circuit is activated when the level of the pixel signal is greater than a second threshold value, and the first threshold value is greater than the second threshold value.

According to some embodiments, a comparator circuit of a column readout circuit of an image sensor includes a main comparator circuit pair of NIN comparator circuit and PIN comparator circuit to extend the input signal range to be almost equivalent to supply voltage. Auxiliary comparator circuits are used to exclude the PIN comparator circuit output when a level of the pixel signal is not smaller than a first reference voltage and exclude the NIN comparator circuit output when the level of the pixel signal is not greater than a second reference voltage. In this way, the linearity of the comparator circuit output is significantly improved. In addition, the comparator circuit in the embodiments of the disclosure may realize to double the comparator input range without increasing the power supply voltage. As such, the supply voltage for the comparator circuit may be reduced significantly because its input range may be extended to almost the same as supply voltage. The image sensor may operate with lower supply voltage to obtain the same input range, thereby reducing the power consumption of the image sensor.

According to some embodiments, a comparator circuit of an image sensor is configured to compare a pixel signal and a ramp signal. The comparator circuit includes a first comparator circuit and a second comparator circuit. The first comparator circuit includes differential inputs that receive the pixel signal and the ramp signal, respectively. The second comparator circuit include differential inputs that receive the pixel signal and the ramp signal, respectively. The second comparator circuit is activated when a level of the pixel signal is smaller than a first threshold value, the first comparator circuit is activated when the level of the pixel signal is greater than a second threshold value, and the first threshold value is greater than the second threshold value.

According to some embodiments, an image sensor includes a pixel array and a plurality of column readout circuits. The pixel array includes a plurality of pixels arranged in a plurality of row lines and a plurality of column lines. The plurality of column readout circuits is coupled to the plurality of column lines, each of the plurality of column readout circuits comprises a comparator circuit configured to compare a pixel signal and a ramp signal. The comparator circuit includes a first comparator circuit and a second comparator circuit. The first comparator circuit includes differential inputs that receive the pixel signal and the ramp signal, respectively. The second comparator circuit includes differential inputs that receive the pixel signal and the ramp signal, respectively. The second comparator circuit is activated when a level of the pixel signal is smaller than a first threshold value, the first comparator circuit is activated when the level of the pixel signal is greater than a second threshold value, and the first threshold value is greater than the second threshold value.

According to some embodiments, a method for comparing a pixel signal and a ramp signal is introduced. The method includes steps of performing a first comparison operation to compare the pixel signal and the ramp signal using a first comparator circuit to generate a first comparison result; performing a second comparison operation to compare the pixel signal and the ramp signal using a second comparator circuit to generate a second comparison result; and generating a readout signal according to the first comparison result and the second comparison result, wherein the second comparator circuit is activated when a level of the pixel signal is smaller than a first threshold value, the first comparator circuit is activated when the level of the pixel signal is greater than a second threshold value, and the first threshold value is greater than the second threshold value.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A comparator circuit of an image sensor, configured to compare a pixel signal and a ramp signal, comprising:
    a first comparator circuit, comprising differential inputs that receive the pixel signal and the ramp signal, respectively; and
    a second comparator circuit, comprising differential inputs that receive the pixel signal and the ramp signal, respectively,
    wherein the second comparator circuit is activated when a level of the pixel signal is smaller than a first threshold value, the first comparator circuit is activated when the level of the pixel signal is greater than a second threshold value, and the first threshold value is greater than the second threshold value.

2. The comparator circuit of claim 1, wherein
    when the level of the pixel signal is greater than the first threshold value, the first comparator circuit is deactivated,
    when the level of the pixel signal is smaller than the second threshold value, the second comparator circuit is deactivated, and
    when the level of the pixel signal is in a range from the second threshold value to the first threshold value, both of the first comparator circuit and the second comparator circuit are activated.

3. The comparator circuit of claim 1, wherein
    each of the first comparator circuit and the second comparator circuit comprises a first stage and a second stage,
    the first stage is configured to receive the pixel signal and the ramp signal to generate a first-stage output signal, and
    the second stage is configured to receive the first-stage output signal and generate a comparator output signal according to the first-stage output signal.

4. The comparator circuit of claim 3, wherein the first stage of the first comparator circuit comprising:
    a N-type differential transistor pair, wherein gate electrodes of the N-type differential transistor pair receive the pixel signal through a first coupling capacitor and the ramp signal through a second coupling capacitor, respectively;

a first current mirror circuit, coupled to drain electrodes of the N-type differential transistor pair; and
a first current source circuit, coupled to source electrodes of the N-type differential transistor pair.

5. The comparator circuit of claim 4, wherein
the N-type differential transistor pair comprises a first N-type transistor that receives the pixel signal through the first coupling capacitor and a second N-type transistor that receives the ramp signal through the second coupling capacitor, and
the first stage of the first comparator circuit further comprises:
a first switch, coupled between a gate electrode of the first N-type transistor and a reference node; and
a second switch, coupled between a gate electrode of the second N-type transistor and an output node of the first stage of the first comparator circuit,
wherein the first switch and the second switch are controlled by a control signal.

6. The comparator circuit of claim 5, further comprising:
a first capacitor; and
a third switch, coupled between the output node of the first stage of the first comparator circuit and the second stage of the first comparator circuit through the first capacitor.

7. The comparator circuit of claim 5, wherein the first stage of the second comparator circuit comprising:
a P-type differential transistor pair, wherein gate electrodes of the P-type differential transistor pair receive the pixel signal through the first coupling capacitor and the ramp signal through the second coupling capacitor, respectively;
a second current mirror circuit, coupled to drain electrodes of the P-type differential transistor pair; and
a second current source circuit, coupled to source electrodes of the P-type differential transistor pair.

8. The comparator circuit of claim 7, wherein
the P-type differential transistor pair comprises a first P-type transistor that receives the pixel signal and a second P-type transistor that receives the ramp signal,
a gate electrode of the first P-type transistor is coupled to the gate electrode of the first N-type transistor to receive the pixel signal, and
a gate electrode of the second P-type transistor is coupled to the gate electrode of the second N-type transistor to receive the ramp signal.

9. The comparator circuit of claim 8, further comprising:
a fourth switch, coupled between the output node of the first stage of the second comparator circuit and a reference node;
a second capacitor; and
a fifth switch, coupled between the output node of the first stage of the second comparator circuit and the second stage of the second comparator circuit through the second capacitor.

10. An image sensor, comprising:
a pixel array, comprising a plurality of pixels arranged in a plurality of row lines and a plurality of column lines; and
a plurality of column readout circuits, coupled to the plurality of column lines, each of the plurality of column readout circuits comprises a comparator circuit configured to compare a pixel signal and a ramp signal, the comparator circuit comprising:
a first comparator circuit, comprising differential inputs that receive the pixel signal and the ramp signal, respectively; and a second comparator circuit, comprising differential inputs that receive the pixel signal and the ramp signal, respectively,
wherein the second comparator circuit is activated when a level of the pixel signal is smaller than a first threshold value, the first comparator circuit is activated when the level of the pixel signal is greater than a second threshold value, and the first threshold value is greater than the second threshold value.

11. The image sensor of claim 10, wherein
when the level of the pixel signal is greater than the first threshold value, the first comparator circuit is deactivated,
when the level of the pixel signal is smaller than the second threshold value, the second comparator circuit is deactivated, and
when the level of the pixel signal is in a range from the second threshold value to the first threshold value, both of the first comparator circuit and the second comparator circuit are activated.

12. The image sensor of claim 10, wherein
each of the first comparator circuit and the second comparator circuit comprises a first stage and a second stage,
the first stage is configured to receive the pixel signal and the ramp signal to generate a first-stage output signal, and
the second stage is configured to receive the first-stage output signal from the first stage and generate a comparator output signal according to the first-stage output signal.

13. The image sensor of claim 12, wherein the first stage of the first comparator circuit comprising:
a N-type differential transistor pair, comprising a first N-type transistor that receives the pixel signal through a first coupling capacitor and a second N-type transistor that receives the ramp signal through a second coupling capacitor,
a first current mirror circuit; coupled to drain electrodes of the N-type differential transistor pair; and
a first current source circuit, coupled to source electrodes of the N-type differential transistor pair.

14. The image sensor of claim 13, wherein the first stage of the second comparator circuit comprising:
a P-type differential transistor pair, comprising a first P-type transistor that receives the pixel signal through the first coupling capacitor and a second P-type transistor that receives the ramp signal through the second coupling capacitor;
a second current mirror circuit; coupled to drain electrodes of the P-type differential transistor pair; and
a second current source circuit, coupled to source electrodes of the P-type differential transistor pair.

15. The image sensor of claim 14, wherein
the first stage of the first comparator circuit further comprises:
a first switch, coupled between a gate electrode of the first N-type transistor and a reference node; and
a second switch, coupled between a gate electrode of the second N-type transistor and an output node of the first stage of the first comparator circuit,
the output node of the first stage of the first comparator circuit is coupled to the second stage of the first comparator circuit through the first capacitor and a third switch, and
the first stage of the second comparator circuit further comprises:

a fourth switch, coupled between a gate electrode of the first P-type transistor and a reference node; and a fifth switch, coupled between a gate electrode of the second P-type transistor and an output node of the first stage of the second comparator circuit.

16. The image sensor of claim 10, further comprising:

a selecting circuit, coupled to the first comparator circuit and the second comparator circuit, configured to generate a first selecting signal and a second selecting signal according to the pixel signal, the first threshold value and the second threshold value; and an output circuit, coupled to the first comparator circuit, the second comparator circuit and the selecting circuit, configured to generate a readout signal according to the first selecting signal and the second selecting signal.

17. The image sensor of claim 16, wherein the selecting circuit comprises:

a third comparator circuit, configured to compare the level of the pixel signal with the second threshold value to generate the first selecting signal; and a fourth comparator circuit, configured to compare the level of the pixel signal with the first threshold value to generate the second selecting signal.

18. The image sensor of claim 16, wherein the output circuit comprises:

a first logic circuit, configured to perform a first logic operation to the first selecting signal and a first comparison result outputted by the first comparator circuit to generate a first logic result;

a second logic circuit, configured to perform a second logic operation to the second selecting signal and a second comparison result outputted by the second comparator circuit to generate a second logic result;

a third logic circuit, configured to perform a third logic operation to the first logic result and the second logic result to generate a third logic result; and a level shifter, coupled to the third logic circuit, configured to generate the readout signal according to the third logic result.

19. A method for comparing a pixel signal and a ramp signal, comprising:

performing a first comparison operation to compare the pixel signal and the ramp signal using a first comparator circuit to generate a first comparison result;

performing a second comparison operation to compare the pixel signal and the ramp signal using a second comparator circuit to generate a second comparison result; and generating a readout signal according to the first comparison result and the second comparison result, wherein the second comparator circuit is activated when a level of the pixel signal is smaller than a first threshold value, the first comparator circuit is activated when the level of the pixel signal is greater than a second threshold value, and the first threshold value is greater than the second threshold value.

20. The method of claim 19, further comprising:

deactivating the first comparator circuit when the level of the pixel signal is greater than the first threshold value;

deactivating the second comparator circuit when the level of the pixel signal is smaller than the second threshold value; and activating both of the first comparator circuit and the second comparator circuit when the level of the pixel signal is in a range from the second threshold value to the first threshold value.

* * * * *